(12) United States Patent
Aoyama et al.

(10) Patent No.: US 8,250,744 B2
(45) Date of Patent: Aug. 28, 2012

(54) METHOD OF MANUFACTURING A SOLAR CELL LEAD WIRE

(75) Inventors: Seigi Aoyama, Kitaibaraki (JP); Hiroshi Bando, Hitachi (JP); Iku Higashidani, Hitachi (JP); Yoshiharu Masaki, Hitachi (JP); Hiroshi Okikawa, Hitachi (JP)

(73) Assignees: Hitachi Cable, Ltd., Tokyo (JP); Hitachi Cable Fine-Tech, Ltd., Hitachi-shi, Ibaraki (JP)

( * ) Notice: Subject to any disclaimer, the term of this patent is extended or adjusted under 35 U.S.C. 154(b) by 80 days.

(21) Appl. No.: 12/458,648

(22) Filed: Jul. 17, 2009

(65) Prior Publication Data
US 2010/0018748 A1    Jan. 28, 2010

(30) Foreign Application Priority Data
Jul. 18, 2008 (JP) .............................. 2008-187751

(51) Int. Cl.
*H01R 43/00*    (2006.01)
(52) U.S. Cl. ................. 29/825; 29/842; 29/843; 29/844
(58) Field of Classification Search .............. 29/825, 29/842, 843, 844
See application file for complete search history.

(56) References Cited

U.S. PATENT DOCUMENTS

| | | | | |
|---|---|---|---|---|
| 3,579,377 A | * | 5/1971 | Schreiner et al. | 427/120 |
| 3,692,578 A | * | 9/1972 | Schreiner et al. | 427/120 |
| 3,782,909 A | * | 1/1974 | Cleary et al. | 428/653 |
| 5,472,739 A | * | 12/1995 | Kubota et al. | 427/319 |
| 7,148,426 B2 | | 12/2006 | Aoyama et al. | |
| 2003/0024733 A1 | | 2/2003 | Aoyama et al. | |
| 2007/0062574 A1 | | 3/2007 | Shiomi et al. | |
| 2008/0076307 A1 | | 3/2008 | Nishi et al. | |
| 2009/0283573 A1 | | 11/2009 | Shiomi et al. | |

FOREIGN PATENT DOCUMENTS

| | | | |
|---|---|---|---|
| CN | 101145586 A | | 3/2008 |
| EP | 1626443 A1 | * | 2/2006 |
| GB | 1108380 | * | 4/1968 |
| JP | 04-293757 | | 10/1992 |
| JP | 07-054118 | | 2/1995 |
| JP | 07243014 A | * | 9/1995 |

(Continued)

OTHER PUBLICATIONS

Chinese Office Action dated Aug. 29, 2011 (with an English Translation).

(Continued)

*Primary Examiner* — Carl Arbes
(74) *Attorney, Agent, or Firm* — McGinn IP Law Group, PLLC (57) ABSTRACT

A solar cell lead wire includes a conductive material, and a solder plated layer on a periphery of the conductive material. The solder plated layer is formed flat by rolling. A method of manufacturing a solar cell lead wire includes feeding an elongate conductive material from a feed reel, the elongate conductive material including a rectangular conductor or a round conductor, soaking the conductive material in a molten solder in a molten solder plating bath, cooling the conductive material to have a plated wire with a solder plated layer formed on the conductive material, and winding the plated wire on a winding reel. The plated wire is formed flat by rolling after the solder plated layer of the plated wire is solidified by the cooling.

16 Claims, 7 Drawing Sheets

FOREIGN PATENT DOCUMENTS

| | | |
|---|---|---|
| JP | 2002-263880 A | 9/2002 |
| JP | 2006-49666 A | 2/2006 |
| JP | 2008-098315 | 4/2008 |
| JP | 2008-543003 A | 11/2008 |
| JP | 2009-98315 A | 5/2009 |
| WO | WO 2004/105141 A1 | 12/2004 |
| WO | WO 2006/128203 A1 | 7/2006 |

OTHER PUBLICATIONS

Notification of Reasons for Refusal dated Oct. 25, 2011 (with an English translation).

Notice dated Mar. 1, 2011, including Information Offer Form filed Feb. 1, 2011 and its English translation.

* cited by examiner

METHOD OF MANUFACTURING A SOLAR CELL LEAD WIRE

The present application is based on Japanese Patent Application No. 2008-187751 filed on Jul. 18, 2008, the entire contents of which are incorporated herein by reference.

BACKGROUND OF THE INVENTION

1. Field of the Invention

The invention relates to a solar cell lead wire, in particular, to a solar cell lead wire with a high cell crack suppressing effect and a method of manufacturing the same.

2. Related Art

In a solar cell, polycrystalline and single crystal Si cells are used as a semiconductor substrate.

Figure 6A:
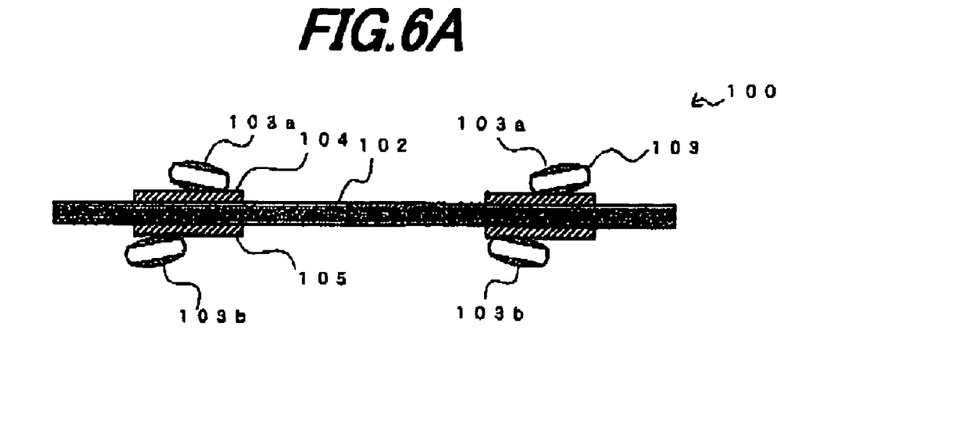
Figure 6B:
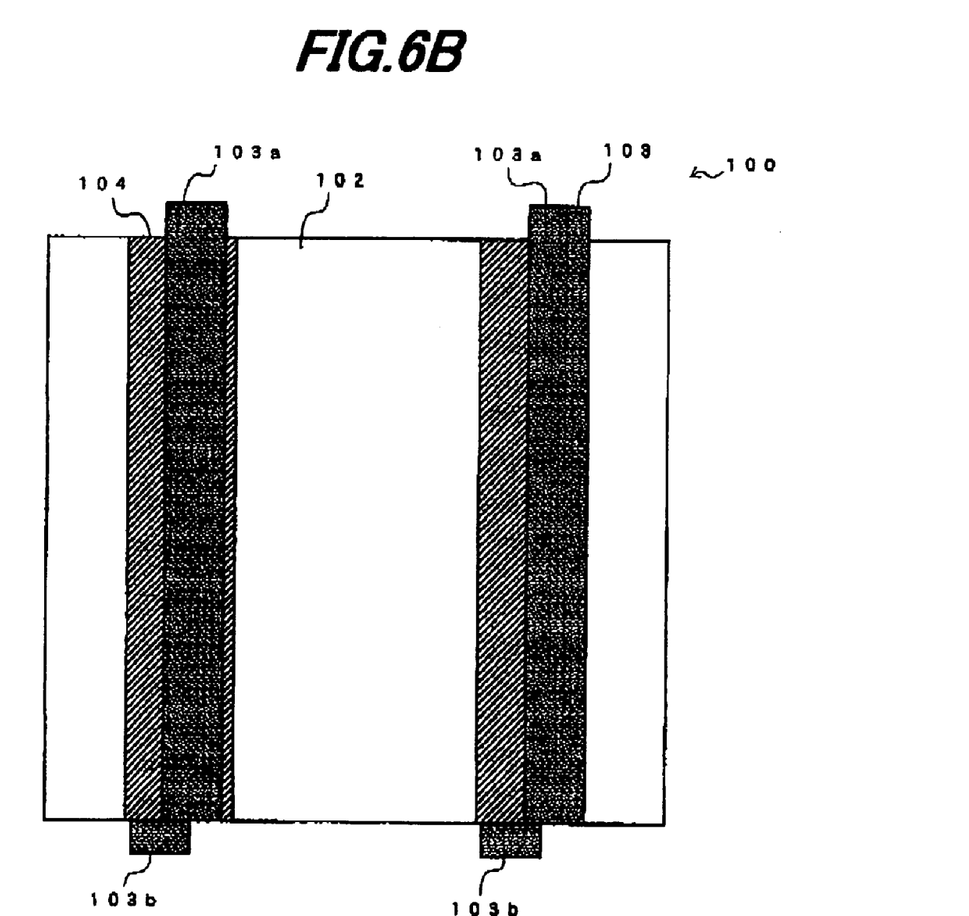

As shown in FIGS. 6A and 6B, a solar cell 100 is manufactured by soldering solar cell lead wires 103a and 103b to a predetermined region of a semiconductor substrate 102, i.e., to a front surface electrode 104 provided on a front surface of the semiconductor substrate 102 and to a back surface electrode 105 provided on a back surface thereof. Electricity generated in the semiconductor substrate 102 is transmitted to the outside through a solar cell lead wire 103.

Figure 7:
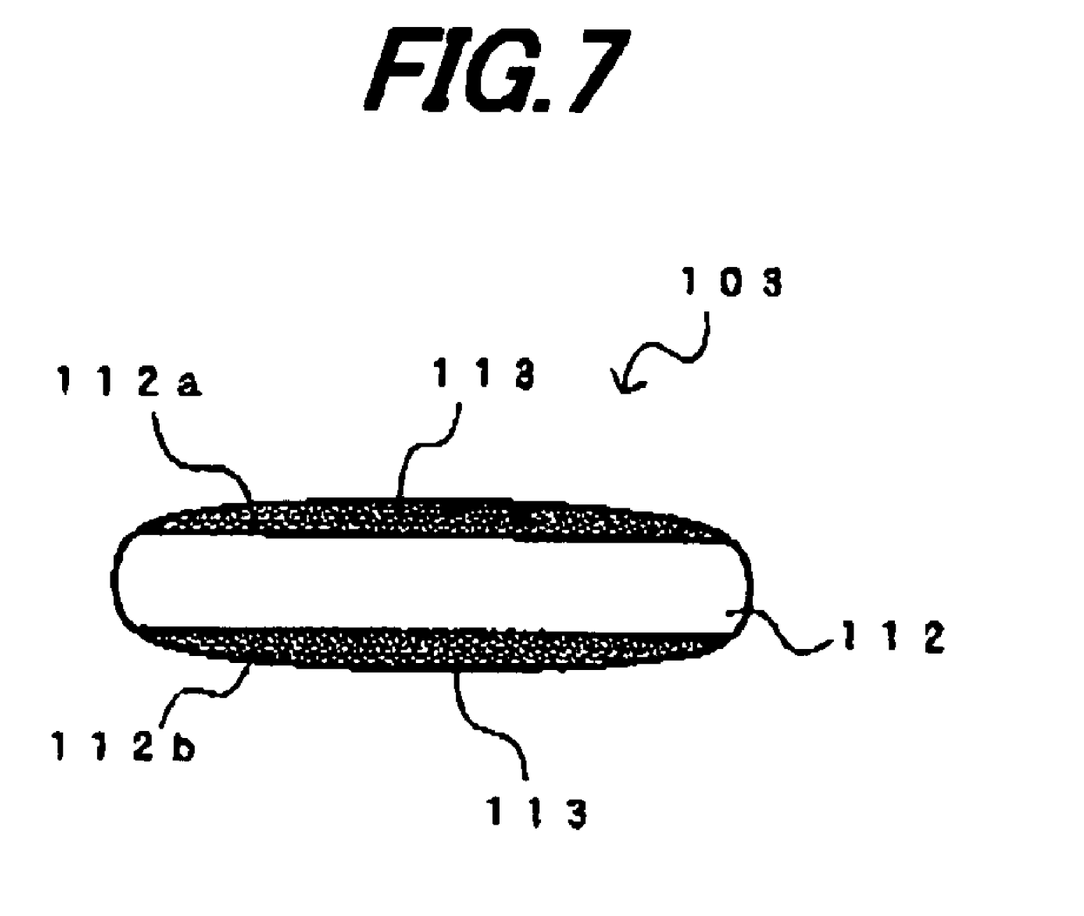
FIG. 7 is a lateral cross-sectional view showing a conventional solar cell lead wire.

As shown in FIG. 7, a conventional solar cell lead wire 103 is provided with a ribbon-shaped conductive material 112 and molten solder plated layers 113 each formed on an upper surface 112a and a lower surface 112b of the ribbon-shaped conductive material 112. The ribbon-shaped conductive material 112 is formed by, e.g., roll processing a circular cross-section conductor into a ribbon shape, which is called a rectangular conductor or a rectangular wire.

The molten solder plated layer 113 is formed by supplying a molten solder on upper and lower surfaces of the ribbon-shaped conductive material 112 using a hot-dip plating method.

The hot-dip plating method is a method in which the upper surface 112a and the lower surface 112b of the ribbon-shaped conductive material 112 are cleaned by acid pickling, etc., and a solder is laminated on the upper surface 112a and the lower surface 112b of the ribbon-shaped conductive material 112 by passing the ribbon-shaped conductive material 112 through a molten solder bath. As shown in FIG. 7, the molten solder plated layer 113 is formed in a shape bulging from a side portion in a width direction to a center portion, so-called a mountain-like shape, by an effect of surface tension at the time of solidification of the molten solder adhered on the upper surface 112a and the lower surface 112b of the ribbon-shaped conductive material 112 (e.g., JP-A-2002-263880).

In the conventional solar cell lead wire 103 shown in FIG. 7, since the molten solder plated layer 113 bulged in a mountain-like shape is formed on the upper surface 112a and the lower surface 112b of the ribbon-shaped conductive material 112, it is possible to increase spread of the molten solder on the upper surface 112a and the lower surface 112b of the ribbon-shaped conductive material 112, thus, there is an advantage in that joint force is strengthened when soldering to the front surface electrode 104 or the back surface electrode 105 of the semiconductor substrate 102.

However, since the molten solder plated layer 113 of the solar cell lead wire 103 is bulged in a mountain-like shape, it is difficult to obtain a stable laminated state at the time of winding on a bobbin and deformation of the winding is likely to occur. The solar cell lead wire 103 may be tangled due to the deformation of the winding, and may not be pulled out.

The solar cell lead wire 103 is cut to a predetermined length, is sucked up by air suction and moved onto the front surface electrode 104 of the semiconductor substrate 102 of FIG. 6, and is soldered to the front surface electrode 104 of the semiconductor substrate 102. An electrode band (not shown) electrically conducting with the front surface electrode 104 is preliminarily formed on the front surface electrode 104. The molten solder plated layer 113 of the solar cell lead wire 103a is placed in contact with the front surface electrode 104, then, soldering is carried out in this state. The soldering of the solar cell lead wire 103b to the back surface electrode 105 of the semiconductor substrate 102 is carried out in the same way.

At this time, since the molten solder plated layer 113 of the solar cell lead wire 103a of FIG. 7 is bulged and the thickness is uneven, a contact area thereof with the an air suction jig is small and a suction force is not sufficient, hence, there is a problem of a fall during the moving operation.

In addition, a contact area of the front surface electrode 104 with the molten solder plated layer 113 becomes small. When the contact area of the front surface electrode 104 with the molten solder plated layer 113 is small, heat conduction from the semiconductor substrate 102 to the molten solder plated layer 113 is not sufficient, which results in generation of a soldering defect.

In addition, the small contact area of the front surface electrode 104 with the molten solder plated layer 113 causes a misalignment between the solar cell lead wire 103a soldered to the front surface electrode 104 and the solar cell lead wire 103b soldered to the back surface electrode 105 when jointing the solar cell lead wires 103a and 103b to both the front and back surfaces of the semiconductor substrate 102, and a cell crack (which means that the semiconductor substrate 102 is cracked) occurs due to the misalignment. Since the semiconductor substrate 102 is expensive, a cell crack is unfavorable.

SUMMARY OF THE INVENTION

Therefore, it is an object of the invention to solve the above-mentioned problem and to provide a solar cell lead wire with a high cell crack suppressing effect and a method of manufacturing the same.

(1) According to one embodiment of the invention, a solar cell lead wire comprises:

a conductive material; and a solder plated layer on a periphery of the conductive material, wherein the solder plated layer is formed flat by rolling.

In the above embodiment (1), the following modifications and changes can be made.

(i) The solder plated layer formed on a front surface of the conductive material comprises substantially a same thickness as that formed on a back surface of the conductive material.

(ii) The conductive material comprises a recess on a surface thereof for receiving the solder plated layer.

(iii) The conductive material comprises a rectangular conductor comprising recesses for receiving the solder plated layer at a position line-symmetrical with respect to a center line of the rectangular conductor in a horizontal direction.

(iv) The solder plated layer comprises a Sn—Pb-based solder or a Pb-free solder.

(v) The conductive material comprises a pure copper.

(2) According to another embodiment of the invention, a method of manufacturing a solar cell lead wire comprises:

feeding an elongate conductive material from a feed reel, the elongate conductive material comprising a rectangular conductor or a round conductor, soaking the conductive material in a molten solder in a molten solder plating bath;

cooling the conductive material to have a plated wire with a solder plated layer formed on the conductive material; and winding the plated wire on a winding reel, wherein the plated wire is formed flat by rolling after the solder plated layer of the plated wire is solidified by the cooling.

In the above embodiment (2), the following modifications and changes can be made.

(vi) The solder plated layer formed on a front surface of the conductive material comprises substantially a same thickness as that formed on a back surface of the conductive material.

(vii) The conductive material previously comprises a recess on a surface thereof for receiving the solder plated layer.

(viii) The conductive material previously comprises a rectangular conductor comprising recesses for receiving the solder plated layer at a position line-symmetrical with respect to a center line of the rectangular conductor in a horizontal direction.

(ix) The conductive material comprises a 0.2% proof stress of 90 MPa or less caused by previously applying a heat treatment to the conductive material.

(x) The method further comprises:

after the rolling, applying a heat treatment to the plated wire at a temperature not higher than a melting point of the solder plated layer to eliminate a processing strain of the solder plated layer caused by the rolling.

(xi) The method further comprises:

after the rolling, applying a heat treatment to the plated wire at a temperature not lower than melting point of the solder plated layer to eliminate a processing strain of the solder plated layer caused by the rolling.

(xii) The method further comprises:

after the heat treatment, further rolling the plated wire for flattening the plated wire.

Points of the Invention

According to one embodiment of the invention, a solar cell is constructed such that solar cell lead wires are soldered to a front surface electrode and a back surface electrode of a semiconductor substrate by a solder plated layer. Since the solder plated layer to be a joint surface for joining the solar cell lead wires with the front surface electrode and the back surface electrode is formed flat, the position of the solar cell lead wires is stabilized on front and back surface of the semiconductor substrate to prevent a misalignment therebetween.

BRIEF DESCRIPTION OF THE DRAWINGS

Next, the present invention will be explained in more detail in conjunction with appended drawings, wherein:

FIG. 5 show a solar cell using the solar cell lead wire of the invention, wherein FIG. 5A is a lateral cross-sectional view thereof and FIG. 5B is a top view thereof;

FIG. 6 show a solar cell using a conventional solar cell lead wire, wherein FIG. 6A is a lateral cross-sectional view thereof and FIG. 6B is a top view thereof.

DESCRIPTION OF THE PREFERRED EMBODIMENTS

A preferred embodiment of the invention will be explained in detail as below in conjunction with appended drawings.

Figure 1A:
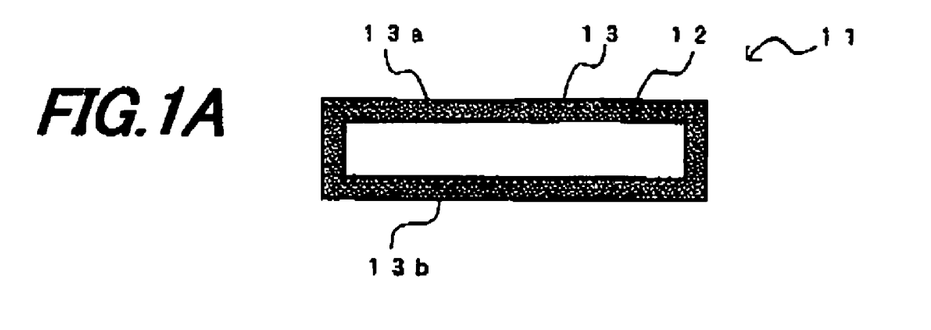
FIGS. 1A, 1B and 1C are lateral cross-sectional views each showing a solar cell lead wire in a preferred embodiment of the invention.
Figure 1B:
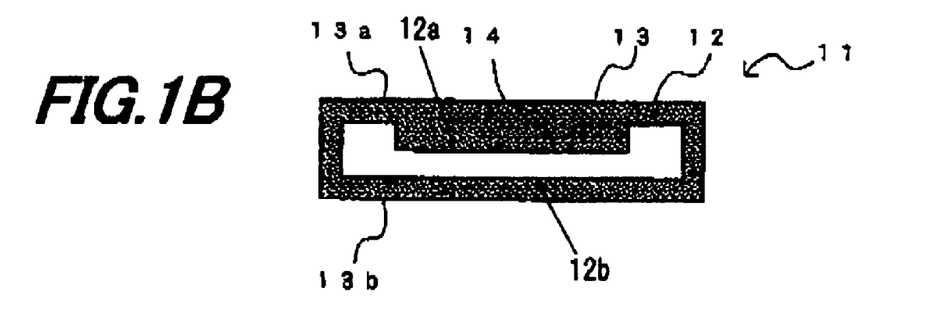
Figure 1C:
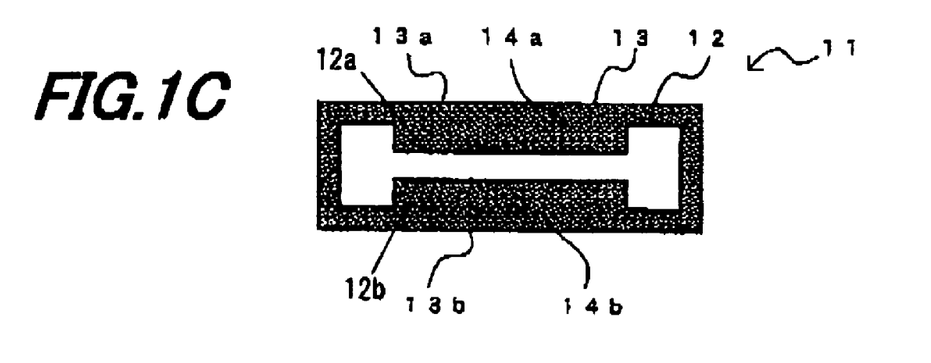

As shown in FIGS. 1A to 1C, a solar cell lead wire 11 of the invention has a molten solder plated layer 13 on a peripheral surface of a conductive material 12 such as a ribbon-shaped conductive material, etc. The molten solder plated layer 13 formed on an upper portion of the conductive material 12 is called an upper molten solder plated layer 13, and the molten solder plated layer 13 formed on a lower portion of the conductive material 12 is called a lower molten solder plated layer 13. In a solar cell lead wire of the invention, the molten solder plated layer 13 is formed flat by rolling.

In the solar cell lead wire 11 of FIG. 1A, the conductive material 12 is composed of, e.g., a rectangular conductor, and an outline of a cross section thereof is rectangular. In the molten solder plated layer 13 formed so as to cover the entire peripheral surface of the conductive material 12, an outline of a cross section is rectangular, and an upper surface 13a and a lower surface 13b are formed flat.

In the solar cell lead wire 11 of FIG. 1B, a recess 14 for storing the molten solder plated layer 13 is formed on one surface (i.e., on an upper surface 12a in this embodiment, however, it may be on a lower surface 12b) of the conductive material 12. The upper surface 13a and the lower surface 13b of the molten solder plated layer 13 are formed flat also in this solar cell lead wire 11.

In the solar cell lead wire 11 of FIG. 1C, recesses 14a and 14b for storing the molten solder plated layers 13 are respectively formed on both surfaces (i.e., on the upper surface 12a and the lower surface 12b) of the conductive material 12. The upper surface 13a and the lower surface 13b of the molten solder plated layer 13 are formed flat also in this solar cell lead wire 11.

In the solar cell lead wire 11 of the invention, the molten solder plated layer 13 is formed flat so as to facilitate installation of the solar cell lead wire 11 to front and back surface electrodes of a semiconductor substrate, and to sufficiently ensure heat conduction required at the time of jointing. As a result, it is possible to neatly install the solar cell lead wires 11 to the front and back surface electrodes, which allows strong soldering.

In addition, in the solar cell lead wire 11 of the invention, since the molten solder plated layer 13 is flat, adhesion properties with the air suction jig are high, and a fall is thereby less likely to occur during the moving operation.

Furthermore, in the solar cell lead wire 11 of the invention, since the molten solder plated layer 13 is flat, a stable laminated state is likely to be obtained when winding on a bobbin, thus, deformation of the winding is less likely to occur. Therefore, a tangle of the solar cell lead wire 11 due to the deformation of the winding, which causes that the solar cell lead wire 11 is not pulled out, does not occur.

The conductive material 12 is formed of, e.g., a rectangular wire (a rectangular conductor) of which volume resistivity is 50 μΩ·mm or less. By roll-processing the rectangular wire, it is possible to obtain the conductive material 12 in a cross-sectional shape having the recesses 14, 14a and 14b as shown in FIGS. 1B and 1C. The conductive material 12 may be formed of a round conductor.

In addition, a manufacturing method of the rectangular conductor is not specifically limited, and it may be a method in which the rectangular conductor is manufactured by slitting a wide rolled stock or a method in which the rectangular conductor is formed by rolling a round conductor.

A manufacturing method of the conductive material is not specifically limited neither, and it may be an upcast method, a SCR method, a Hazelett method, a downcast method or pro-Properzi method.

The conductive material 12 is formed of any of Cu, Al, Ag or Au. Alternatively, the conductive material 12 is formed of so-called pure copper, e.g., any of tough pitch Cu, low-oxygen Cu, oxygen-free Cu, phosphorus deoxidized Cu or high purity Cu having a purity of 99.9999% or more.

As the molten solder plated layer 13, a Sn-based solder (a Sn-based solder alloy) is used. In the Sn-based solder, Sn is used as a first component of which component weight is the heaviest, and 0.1 mass % or more of at least one element selected from Pb, In, Bi, Sb, Ag, Zn, Ni and Cu is contained as a second component. The molten solder plated layer 13 can be formed of a solder not containing lead, e.g., a Sn—Ag—Cu-based solder, a Sn—Ag—Cu—P-based solder, a Sn—Bi—Ag-based solder and a Sn—Bi—Ag—P-based solder, besides a Sn—Pb-based solder and a Sn—Pb—P-based solder.

Next, Table 1 shows physicality of the material of the conductive material 12 used in the invention.

TABLE 1

| Material | Cu | Ag | Au | Al |
|---|---|---|---|---|
| Thermal expansion coefficient ($\times 10^{-6}/°$ C.) | 17.0 | 19.1 | 29.1 | 23.5 |
| 0.2% proof stress (MPa) | 40 | 55 | 30 | 20 |
| Volume resistivity ($\mu\Omega \cdot$ mm) | 16.9 | 16.3 | 22.0 | 26.7 |

The conductive material 12 is preferably composed of a material having relatively small volume resistivity. As shown in Table 1, the material of the conductive material 12 is Cu, Al, Ag or Au, etc.

The volume resistivity of the Ag is the lowest among Cu, Al, Ag and Au. Therefore, when Ag is used as the conductive material 12, it is possible to maximize power generation efficiency of a solar cell using the solar cell lead wire 11. When Cu is used as the conductive material 12, it is possible to reduce cost of the solar cell lead wire 11. When Al is used as the conductive material 12, it is possible to reduce weight of the solar cell lead wire 11.

When Cu is used as the conductive material 12, any of tough pitch Cu, low-oxygen Cu, oxygen-free Cu, phosphorus deoxidized Cu or high purity Cu having a purity of 99.9999% or more may be used for the Cu. In order to minimize the 0.2% proof stress of the conductive material 12, it is advantageous to use highly-pure Cu. Therefore, when the high purity Cu having a purity of 99.9999% or more is used, it is possible to decrease the 0.2% proof stress of the conductive material 12. When the tough pitch Cu or the phosphorus deoxidized Cu is used, it is possible to reduce cost of the solar cell lead wire 11.

A solder used for the molten solder plated layer 13 includes a Sn-based solder, or a Sn-based solder alloy in which Sn is used as a first component and 0.1 mass % or more of at least one element selected from Pb, In, Bi, Sb, Ag, Zn, Ni and Cu is contained as a second component. These solders may contain 1000 ppm or less of trace element as a third component.

A method of manufacturing the solar cell lead wire of the invention will be explained below.

In order to manufacture the solar cell lead wire 11 shown in FIGS. 1A to 1C, a molten solder is supplied on upper and lower surfaces of the conductive material 12, the conductive material 12 in which solder plating becomes a solid state at a solder bath outlet port is inserted into a cooling unit 26 (see FIG. 2), and the molten solder plated layers 13, 13 on and under the conductive material 12 are formed flat by rolling the cooled solder plated wire by a mill role. Here, "flat" indicates that a level difference of irregularity with reference to a surface of plating is 7 µm or less.

The conductive material 12 may be formed by a rolling process of a wire (a wire rod having a circular cross section) and substantial heat treatment in a continuous electrical heating furnace, a continuous heating furnace or a batch-type heating equipment.

Figure 2:
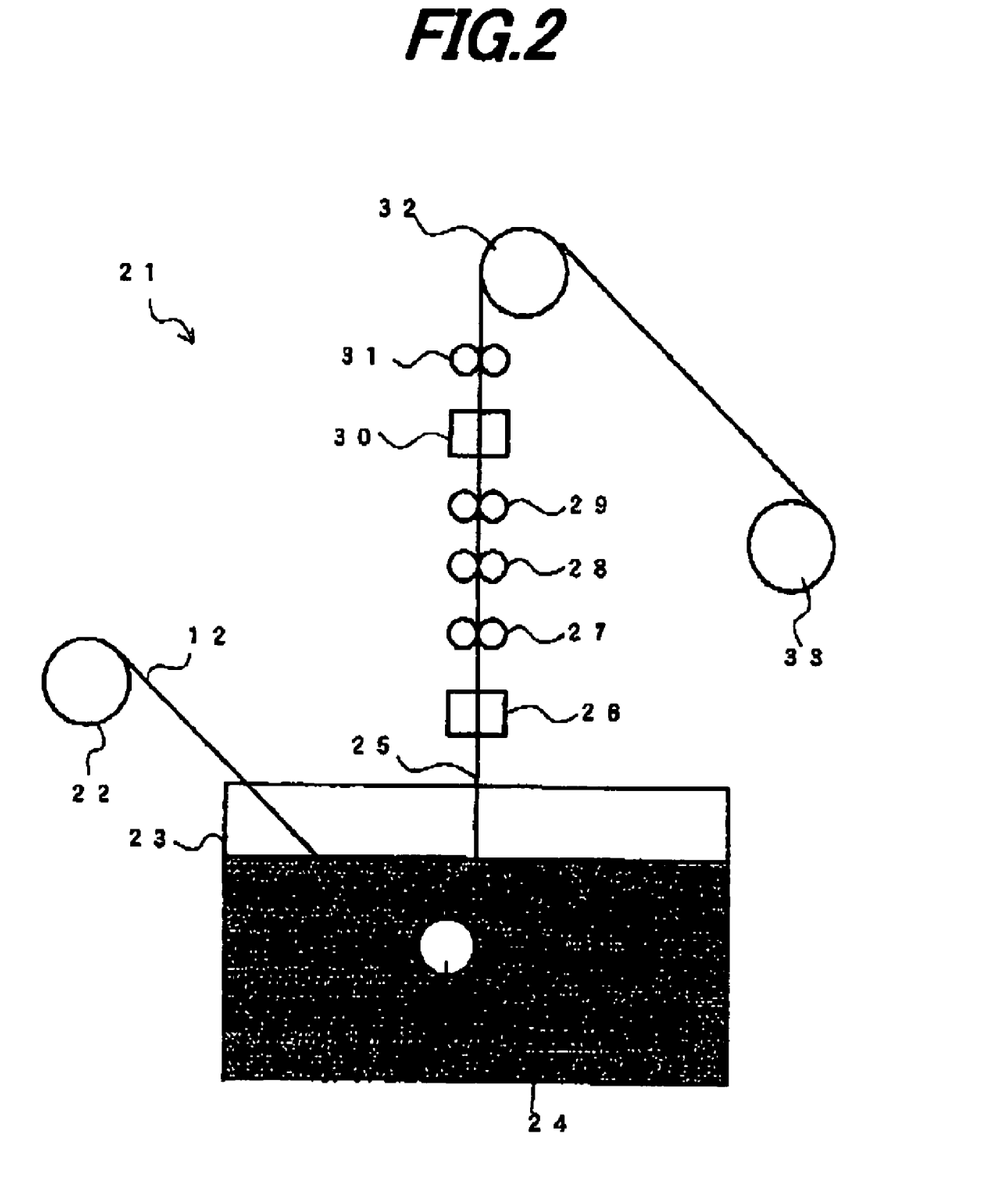
FIG. 2 is a schematic diagram illustrating a molten solder plated layer forming equipment used for a method of manufacturing the solar cell lead wire of the invention.

FIG. 2 shows a hot-dip plating equipment 21 for flattening the molten solder plated layers 13, 13. The hot-dip plating equipment 21 includes a feed reel 22 for feeding a long conductive material 12 formed of a rectangular conductor or a round conductor, a solder bath (molten solder plating bath) 23, a reverse roller 24 provided in the solder bath 23 for reversing and directing the conductive material 12 upwards, a cooling unit 26 provided outside of the solder bath 23 above the reverse roller 24 for cooling a molten solder plated wire 25, mill rolls 27, 28 and 29 provided above the cooling unit 26 in multiple tiers one above the other and each composed of a pair of right and left rollers, a heating unit 30 for heat treating the molten solder plated wire 25, a mill roll 31 provided above the heating unit 30 and composed of a pair of right and left rollers, a lifting roller 32 provided in an uppermost portion, and a winding reel 33 for winding up the molten solder plated wire 25.

A solder is supplied on upper, lower and side surfaces of the conductive material 12 by dipping in the solder bath 23, then, the conductive material 12 is reversed at the reverse roller 24 and directed upwards.

Figure 3:
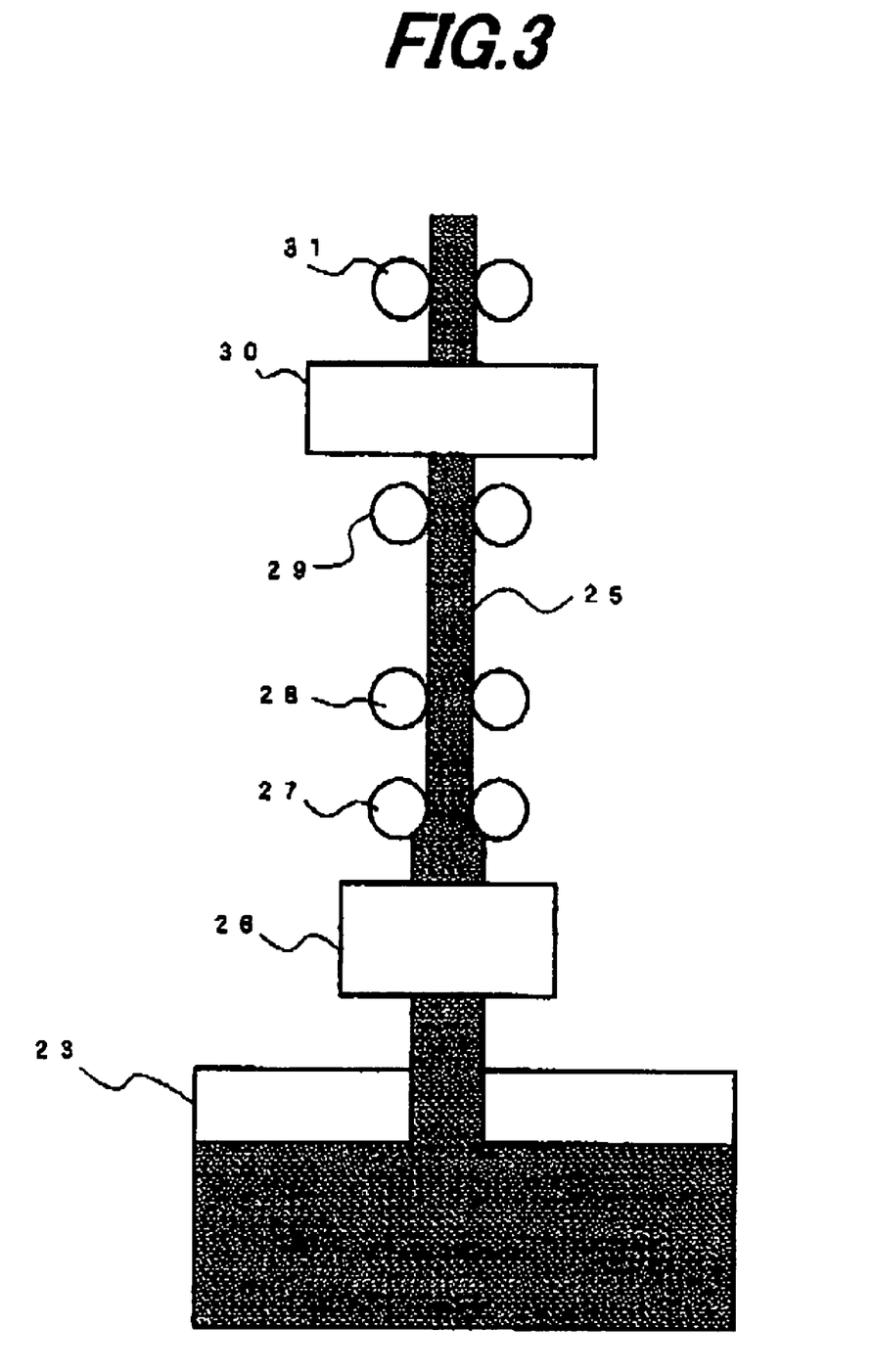
FIG. 3 is a partial enlarged view showing the molten solder plated layer forming equipment of FIG. 2.

As shown in FIG. 3, the molten solder plated wire 25 in a molten state is fed to the cooling unit 26. In the cooling unit 26, the molten solder plated wire 25 is made in a solid state by cooling by, e.g., blowing air of 50° C. or less. The molten solder plated wire 25 in the solid state is rolled by the mill rolls 27, 28 and 29 in multiple tiers, and is further rolled by the mill roll 31, which results in that the final thickness of the plating is adjusted.

As a result, the solar cell lead wires 11 having the flat molten solder plated layers 13, 13 as shown in FIGS. 1A to 1C are manufactured.

In the cooling unit 26, it is not limited to the blowing of the air of 50° C. or less, quick solidification by blowing a single inert gas such as Ar or Ni, etc., or a mixed gas thereof at a temperature below the room temperature for antioxidation is desirable for enhancing production efficiency.

Here, equalization (planarization) of the plating film thickness by the cooling unit 26 is explained.

1) In the Case that a Raw Copper Material is a Ribbon-shaped Conductive Material When a ribbon-shaped conductive material (a rectangular conductor) is used as the conductive material 12, the molten solder plating is applied and substantially cooled, and the molten solder is thereby solidified on the peripheral surface of the conductive material 12 by surface tension in a shape to be minimum size. At this time, spread of the molten solder plating on a circumferential surface of the conductive material 12 is constant. The molten solder plated layer 13 is plastic-formed by rolling the molten solder plated wire 25, thereby processed into the rectangular-shaped solar cell lead wire 11 in which thicknesses of the molten solder plated layers 13 on the upper and lower surfaces are constant and surface quality thereof is uniform.

Since processing strain of the plastic-formed molten solder plated layer 13 is removed after cooling (rapid cooling), it is preferable to perform low-temperature heat treatment (e.g., radio-frequency heating at 150-230° C.). As a result, the solar cell lead wire 11 having low 0.2% proof stress value can be realized inline by the same process as a molten solder plating coating process.

2) In the Case that a Raw Copper Material is a Round Wire

When a round conductor is used as the conductive material 12, the molten solder plating is applied to a circumference surface of the round conductor and substantially cooled, and the molten solder is solidified by surface tension in a shape to be minimum size. At this time, spread of the molten solder plating on the circumferential surface of the round conductor is substantially constant. The round conductor and the molten solder plated layer 13 are plastic-formed by rolling the molten solder plated wire 25. The round conductor is plastic-deformed into a ribbon-shaped conductive material, thereby processed into the rectangular-shaped solar cell lead wire 11 in which thicknesses of the molten solder plated layers 13 on the upper and lower surfaces of the round conductor are uniform.

Also in this case, since processing strains of the plastic-formed ribbon-shaped conductive material and the molten solder plated layer are removed, it is preferable to perform high-temperature heat treatment (e.g., radio-frequency heating at 500-600° C.). As a result, the solar cell lead wire having low 0.2% proof stress value can be realized inline by the same process as a molten solder plating coating process. Slight rolling is further applied by cold rolling, thereby an accurate rectangular wire in which the plating film thickness of the upper and lower surfaces are constant. The "slight rolling" here means about 0.2-1% of a processing degree.

In order to form flat molten solder plated layers 13, 13 on the conductive material 12, the mill rolls 27, 28 and 29 are arranged so as to sandwich the upper and lower surfaces of the conductive material 12 (which are positioned on right and left sides in the hot-dip plating equipment 21) above the solder bath 23. By fine adjusting a distance between pairs of right and left rollers of the mill rolls 27, 28 and 29, it is possible to adjust a plating thickness of the molten solder plated layers 13, 13 and a lateral cross-sectional shape of the molten solder plated layer 13.

In other words, in the hot-dip plating equipment 21, when the molten solder plated layer 13 is formed on the peripheral surface of the conductive material 12, a path of the conductive material 12 running up and down in the hot-dip plating equipment 21 is determined by the reverse roller 24 and a lifting roller 32, and it is possible to adjust layer thicknesses of the upper and lower molten solder plated layers 13 and also to adjust the entire layer thickness by fine-adjusting a vertical position and a horizontal distance of each of the mill rolls 27, 28 and 29 with respect to the path. As for the entire layer thickness, firstly, an initial thickness is determined by a distance between the rollers of the lower mill roll 27, and the final thickness is determined by a distance between the rollers of the uppermost mill roll 31. Further, when the molten solder plated wire 25 is reversed by the lifting roller 32, the upper surface of the molten solder plated wire 25 becomes the upper molten solder plated layer 13 and the lower surface thereof becomes the lower molten solder plated layer 13, however, as for the mill rolls which determine flatness of the molten solder plated layer 13, since the flatness of the upper molten solder plated layer 13 is determined by a roller on a left side in the figure and the flatness of the lower molten solder plated layer 13 is determine by a roller on a right side, it is possible to adjust the flatness of the molten solder plated layer 13 by adjusting the positions of these mill rolls with respect to the path.

For the conductive material 12 processed by slitting, materials having various widths can be used. In other words, even when a width of the conductive material 12 is not uniform in a longitudinal direction or even when various conductive materials 12 having different widths are used, it is possible to form the long conductive material 12 having a uniform width in a longitudinal direction by the slit processing.

Next, a method of manufacturing a solar cell using the solar cell lead wire 11 of the invention will be explained.

When the solar cell lead wire 11 of the invention is soldered to a front surface electrode 54 and a back surface electrode 55 of a semiconductor substrate 52 shown in FIG. 5, heating temperature of the solar cell lead wire 11 or the semiconductor substrate 52 is controlled to a temperature near a melting point of the solder of the molten solder plated layer 13. The reason for this is that a coefficient of thermal expansion of the conductive material 12 (e.g., formed of copper) of the solar cell lead wire 11 is largely different from that of a semiconductor substrate (formed of Si). Heat stress which causes generation of a crack on the semiconductor substrate 52 is generated due to the difference of the coefficient of thermal expansion. Low-temperature joint can be carried out in order to decrease the heat stress. Therefore, the heating temperatures of the solar cell lead wire 11 and the semiconductor substrate 52 is controlled to a temperature near the melting point of the solder of the molten solder plated layer 13.

In a heating method for joining the solar cell lead wire 11 to the front surface electrode 54 and the back surface electrode 55, the semiconductor substrate 52 is placed on a hot plate, and heat from the hot plate is used together with heat from upside of the solar cell lead wire 11 placed on the semiconductor substrate 52.

In order to increase a contact area of the front surface electrode 54 and the back surface electrode 55 of the semiconductor substrate 52 with the molten solder plated layer 13 for obtaining sufficient heat conduction from the semiconductor substrate 52 to the molten solder plated layer 13, a shape of the solar cell lead wire 11 including the molten solder plated layer 13 can be rectangular.

Additionally, since the molten solder plated layer 13 of the solar cell lead wire 11 of the invention is formed flat, the upper and lower surfaces of the solar cell lead wire 11 are flat. Therefore, when the solar cell lead wires 11 are jointed with both the front and back surfaces of the semiconductor substrate 52, a misalignment does not occur between the solar cell lead wire 11 soldered to the front surface electrode 54 and the solar cell lead wire 11 soldered to the back surface electrode 55.

In addition, in the solar cell lead wires 11 of the invention, since, unlike the conventional solar cell lead wire 103, a misalignment does not occur even if the flat molten solder plated layers 13 are formed thick on the upper and lower surfaces of the conductive material 12 and a sufficient solder can be supplied during the joint, a solder fillet which is formed on a front surface electrode of Si cell after jointing the solar cell lead wires 11 can be made in a stable mountain-like shape. The "fillet" indicates wax or solder protruding from a gap at a joint to which brazing or soldering was carried out.

Next, a method of manufacturing the solar cell lead wire 11 of the invention will be explained in more detail.

Firstly, a ribbon-shaped conductive material is formed by rolling a wire rod having a circular cross sectional shape (not shown) as a raw material, or by slitting a plate. The ribbon-shaped conductive material is heat treated in a continuous electrical heating furnace, a continuous heating furnace or a batch-type heating equipment, thereby obtaining the conductive material 12. After that, the molten solder plated layer 13 is formed by supplying the molten solder on the peripheral surface of the conductive material 12 using the hot-dip plating equipment 21 of FIG. 2, and is subsequently flattened.

In general, a solid or a liquid has a property to become as small as possible since intermolecular force functions between internal molecules inside the solid or the liquid. Since the molecule on the surface is surrounded by different molecules on one side, it is in a high internal energy state, and the excess energy is changing into a stable state. In case that a solder (liquid) is in contact with air, since the intermolecular force in the air is extremely small compared with that in the solder, the molecules on the surface of the solder is not pulled by the molecules on the air side, hence, is pulled only by the molecules inside the solder. Therefore, the molecules on the solder surface are constantly entering into the solder and, as a result, the solder surface is becoming a spherical shape with the smallest surface area (with few elements for composing the solder).

In the conventional solar cell lead wire 103 shown in FIG. 7, the molten solder plated layers 113 solidified in a bulging shape like a bump are formed on the upper and lower surfaces of the conductive material 112 by such a force acting to decrease the surface area (surface tension). The solder which normally comes in a spherical shape does not become a spherical shape because interactive force at an interface with the ribbon-shaped conductive material 112 (interfacial tension between the solder and the ribbon-shaped conductive material 112) acts on the solder.

In contrast, in the solar cell lead wire 11 of the invention, the molten solder plated layer 13 can be formed flat by passing the solder between the rolls after the solidification thereof.

As a method for processing a raw material into a ribbon-shaped conductive material, both a rolling process and a slit processing are applicable. The rolling process is a method to rectangularize a round wire by rolling. When the ribbon-shaped conductive material is formed by the rolling process, it is possible to form a long ribbon-shaped conductive material having a uniform width in a longitudinal direction. Materials having various widths can be dealt by the slit processing. In other words, even when a width of a raw conductive material is not uniform in a longitudinal direction or even when various raw conductive materials having different widths are used, it is possible to form the long ribbon-shaped conductive material having a uniform width in a longitudinal direction by the slit processing.

It is possible to improve flexibility of the conductive material 12 by heat treating the conductive material 12. Improving the flexibility of the conductive material 12 is advantageous for reducing 0.2% proof stress. A heat treatment method includes continuous electrical heating, continuous heating and batch heating. The continuous electrical heating and the continuous heating are preferable for continuously heat treating over a long length. When stable heat treatment is required, the batch heating is preferable. From the point of view of preventing oxidation, it is preferable to use a furnace with an inert gas atmosphere such as nitrogen, etc., or for low-oxygen cooper other than tough pitch copper, to use a furnace with a hydrogen reduction atmosphere.

The furnace with an inert gas atmosphere or with a hydrogen reduction atmosphere is provided by the continuous electrical heating furnace, the continuous heating furnace or the batch-type heating equipment.

Next, a method of manufacturing a solar cell using the solar cell lead wire 11 of the invention will be explained.

Figure 5A:
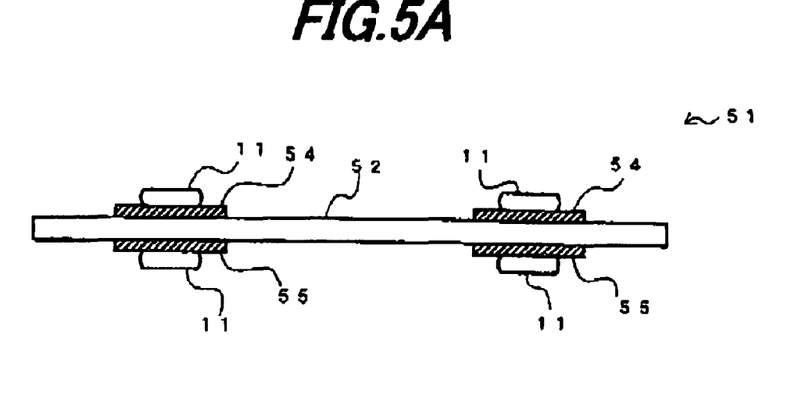
Figure 5B:
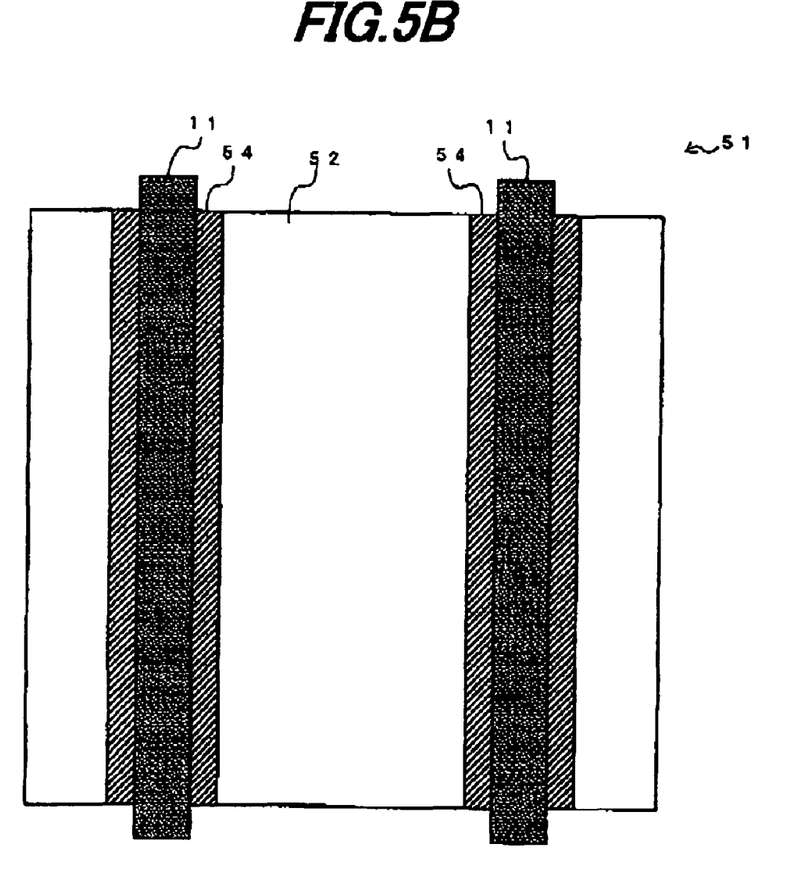

As shown in FIGS. 5A and 5B, in a solar cell 51, the solar cell lead wires 11 as has been described above are soldered to the front surface electrode 54 and the back surface electrode 55 of the semiconductor substrate 52 by the solder of the molten solder plated layer 13.

Since the molten solder plated layer 13 to be a joint surface of the solar cell lead wire 11 with the front surface electrode 54 and the back surface electrode 55 is flat, the position of the solar cell lead wire 11 is stabilized on front and back of the semiconductor substrate 52, thereby preventing a misalignment.

According to the solar cell 51 of the invention, since joint strength between the solar cell lead wire 11 and a semiconductor substrate is high and a cell crack at the time of jointing can be suppressed, it is possible to improve yield of a solar cell.

EXAMPLES

Example 1

Figure 4A:
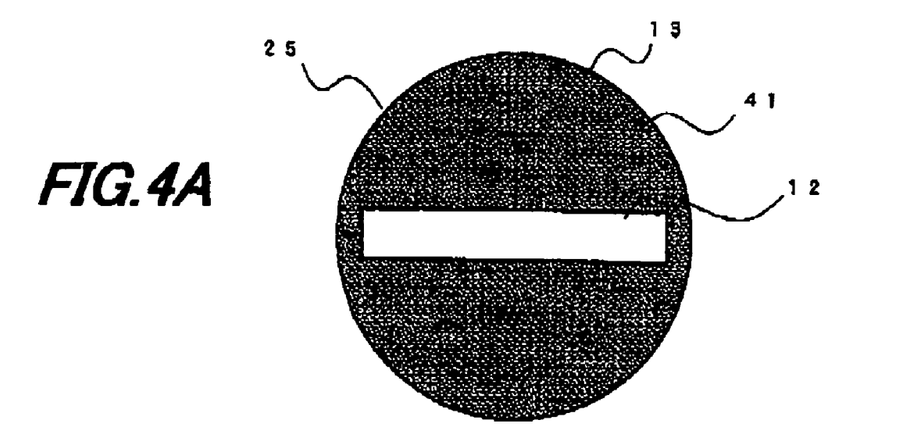
FIGS. 4A, 4B, 4C and 4D are lateral cross-sectional views showing a molten solder plated wire during a manufacturing process of the solar cell lead wire of the invention.

A Cu material as a raw conductive material is roll processed, thereby forming a rectangular-shaped conductive material 12 of 2.0 mm in width and 0.16 mm in thickness. The conductive material 12 is heat treated (at 800° C. for 60 seconds, which allows recrystallization) in a batch-type heating equipment (high-frequency heat source). Sn-3% Ag-0.5% Cu solder plating is applied on the peripheral surface of the conductive material 12 in the hot-dip plating equipment 21 shown in FIG. 2. At this time, in the molten solder plated wire 25, a solder 41 plated on the peripheral surface of the conductive material 12 has a circular cross-sectional outline, as shown in FIG. 4A. The molten solder plated layers 13 on the upper and lower surface of the conductive material 12 have a plating thickness of 20 µm at a center portion.

Figure 4B:
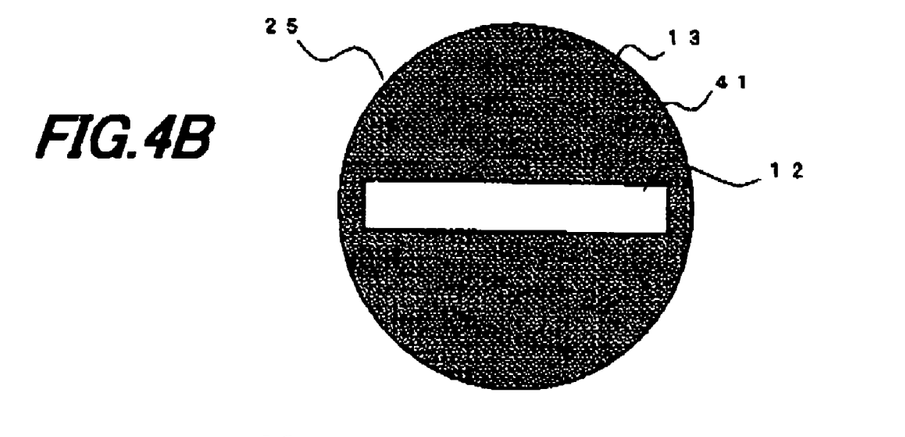
Figure 4C:
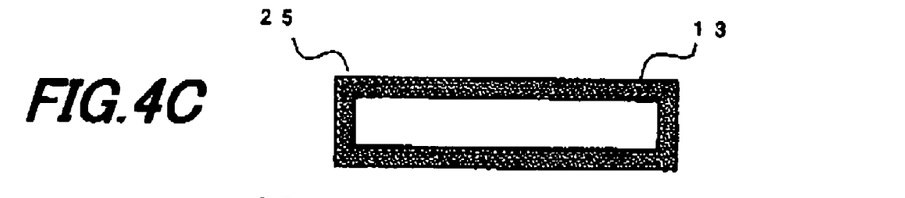

The molten solder plated wire 25 is cooled by blowing air of 50° C. At this time, in the molten solder plated wire 25, the solder 41 plated on the peripheral surface of the conductive material 12 has a circular cross-sectional outline, as shown in FIG. 4B. Substantially, the molten solder plated wire 25 is formed flat as shown in FIG. 4C by rolling using a mill roll. The conductive material 12 is heat treated Cu.

Figure 4D:
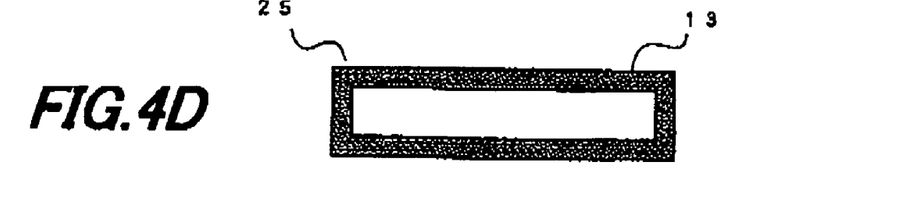

After that, as shown in FIG. 4D, the solar cell lead wire 11 of FIG. 1A was obtained by applying radio-frequency heating to the molten solder plated wire 25 at a melting point or less of the solder (150° C.) for 10 seconds.

Example 2

A Cu material as a raw conductive material is roll processed, thereby forming a rectangular-shaped conductive material 12 of 2.0 mm in width and 0.16 mm in thickness. The difference from the Example 1 is that heat treatment by high-frequency heat source is not applied to this conductive material 12 at this point. Sn-3% Ag-0.5% Cu solder plating is applied on the peripheral surface of the conductive material 12 in the hot-dip plating equipment 21 shown in FIG. 2. At this time, in the molten solder plated wire 25, the solder 41 plated on the peripheral surface of the conductive material 12 has a circular cross-sectional outline, as shown in FIG. 4A. The molten solder plated layers 13 on the upper and lower surface of the conductive material 12 have a plating thickness of 20 µm at a center portion. The molten solder plated wire 25 is cooled by blowing air of 50° C. At this time, in the molten solder plated wire 25, the solder 41 plated on the peripheral surface of the conductive material 12 has a circular cross-sectional outline, as shown in FIG. 4B. The molten solder plated wire 25 is formed flat as shown in FIG. 4C by rolling using a mill roll. The conductive material 12 is heat treated Cu. After that, as shown in FIG. 4D, the radio-frequency heating is applied to the molten solder plated wire 25 at a melting point or more of the solder (500° C. for 10 seconds) in order to remove a strain of the conductive material and the solder plated layer for decreasing 0.2% proof stress of the molten solder plated wire below 90 MPa. The molten solder plated wire 25 is further rolled at a processing degree of 0.8%.

As mentioned above, the solar cell lead wire 11 of FIG. 1A was obtained.

Example 3

A Cu material as a raw conductive material is roll processed, thereby forming a conductive material 12 of 2.0 mm in width and 0.16 mm in thickness having a concave portion on an upper surface thereof. The conductive material 12 is heat treated (at 800° C. for 60 seconds) in a batch-type heating equipment (high-frequency heat source). The solder plating is applied to the conductive material 12 in the hot-dip plating equipment 21 shown in FIG. 2, thereby obtaining the molten solder plated layers 13 (with the plating thickness of 20 µm at a center portion) on the upper and lower surfaces of the conductive material 12. After the cooling (by blowing air of 50° C.), the molten solder plated wire 25 is formed flat by rolling using a mill roll. The conductive material 12 is heat treated Cu. After that, the solar cell lead wire 11 of FIG. 1B was obtained by applying radio-frequency heating to the molten solder plated wire 25.

In this configuration, since the recess 14 is configured to store the molten solder plating, it is possible to provide a sufficient filling amount of the solder and to contribute to joint properties even if the molten solder plated layer 13 is formed flat.

Example 4

A Cu material as a raw conductive material is roll processed, thereby forming a conductive material 12 of 2.0 mm in width and 0.16 mm in thickness having a concave portion on an upper surface thereof. The difference from the Example 3 is that heat treatment by high-frequency heat source is not applied to this conductive material 12 at this point. The solder plating is applied to the conductive material 12 in the hot-dip plating equipment 21 shown in FIG. 2, thereby obtaining the molten solder plated layers 13 (with the plating thickness of 20 µm at a center portion) on the upper and lower surfaces of the conductive material 12. After the cooling (by blowing air of 50° C.), the molten solder plated wire 25 is formed flat by rolling using a mill roll. After that, the radio-frequency heating is applied to the molten solder plated wire 25 at a melting point or more of the solder (500° C. for 10 seconds), and the rolling is further performed at a processing degree of 0.8%. As mentioned above, the solar cell lead wire 11 of FIG. 1B was obtained.

Example 5

A Cu material as a raw conductive material is roll processed, thereby forming a conductive material 12 of 2.0 mm in width and 0.16 mm in thickness having concave portions on upper and lower surfaces thereof. The conductive material 12 is heat treated (at 800° C. for 60 seconds) in a batch-type heating equipment (high-frequency heat source). The solder plating is applied to the conductive material 12 in the hot-dip plating equipment 21 shown in FIG. 2, thereby obtaining the molten solder plated layers 13 (with the plating thickness of 20 µm at a center portion) on the upper and lower surfaces of the conductive material 12. Subsequently, the molten solder plated wire 25 is formed flat. After that, as shown in FIG. 4D, the radio-frequency heating is applied to the molten solder plated wire at a melting point or less (150° C. for 10 seconds), thereby obtaining the solar cell lead wire 11 of FIG. 1B.

Example 6

A Cu material as a raw conductive material is roll processed, thereby forming a conductive material 12 of 2.0 mm in width and 0.16 mm in thickness having concave portions on upper and lower surfaces thereof. The solder plating is applied to the conductive material 12 in the hot-dip plating equipment 21 shown in FIG. 2, thereby obtaining the molten solder plated layers 13 (with the plating thickness of 20 µm at a center portion) on the upper and lower surfaces of the conductive material 12. After that, the molten solder plated layer 13 is formed flat. After that, the radio-frequency heating is applied at a melting point or more of the solder (500° C. for 10 seconds), and the rolling is further performed at a processing degree of 0.8%. A plating condition is adjusted so that the plating thickness at the edge portion is 5 µm.

As mentioned above, the solar cell lead wire 11 of FIG. 1C was obtained.

In this configuration, since the recesses 14a and 14b on both the upper and lower surfaces of the conductive material 12 are configured to store the molten solder plating, it is possible to provide a sufficient filling amount of the solder and to contribute to joint properties when both the upper and lower surfaces of the conductive material 12 are used as a joint surface even if the molten solder plated layer 13 is formed flat.

Comparative Example 1

A Cu material as a raw conductive material is roll processed, thereby forming a ribbon-shaped conductive material 112 in a rectangular shape of 2.0 mm in width and 0.16 mm in thickness. The ribbon-shaped conductive material 112 is heat treated in a batch-type heating equipment, and further, the solder plating is applied to the peripheral surface of the ribbon-shaped conductive material 112, which results in that the molten solder plated layers 113 (with the plating thickness of 20 µm at a center portion) bulging in a mountain-like shape were formed on flat upper and lower surfaces of the ribbon-shaped conductive material 112. The ribbon-shaped conductive material 112 is heat treated Cu.

As mentioned above, the solar cell lead wire 103 of FIG. 7 was obtained.

Comparative Example 2

A Cu material as a raw conductive material is roll processed, thereby forming a rectangular-shaped conductive material 12 of 2.0 mm in width and 0.16 mm in thickness. This ribbon-shaped conductive material is heat treated in a batch-type heating equipment (high-frequency heat source). Sn-3%Ag-0.5%Cu solder plating is applied on the peripheral surface of the conductive material 12 in the hot-dip plating equipment 21 shown in FIG. 2. The molten solder plated layer 13 is formed flat by rolling using a mill roll while the molten solder plated layers 13 on the upper and lower surfaces of the conductive material 12 remain in a molten state. The conductive material 12 is heat treated Cu. After that, the radio-frequency heating is applied and the rolling is further performed at a processing degree of 0.8%.

As mentioned above, the solar cell lead wire 11 of FIG. 1A was obtained.

As a result of observing cross sections of the solar cell lead wires of Examples 1-6 and Comparative Examples 1 and 2, it was confirmed that upper and lower surfaces to be jointed to a semiconductor substrate are all flat in Examples 1-6.

In Comparative Example 1, each of upper and lower surfaces to be jointed to a semiconductor substrate has a cross section in a mountain-like shape bulging at a center portion.

An appropriate amount of rosin based flux was applied to the solar cell lead wires of Examples 1-6 and Comparative Examples 1 and 2, each solar cell lead wire was placed on a copper plate, hot plate heating was performed (maintaining at 260° C. for 30 seconds), and the solar cell lead wire was soldered to the copper plate. Further, 90° peeling test was conducted for evaluating joint force of the solar cell lead wire soldered to the copper plate against the copper plate. In addition, the solar cell lead wires are placed at electrode sites on both surfaces of a semiconductor substrate (Si cell) of 150 mm vertical×150 mm horizontal×180 μm in thickness, and was soldered by the hot plate heating in the same manner (maintaining at 260° C. for 30 seconds) in a state that 10 g of weight was placed. A state of a cell crack generated during the soldering was investigated. As for Example 2, the test was conducted for the case where the upper surface is jointed and for the case where the lower surface is jointed, then, the state of a cell crack in each case was investigated.

Evaluation results of Examples 1-6 and Comparative Examples 1 and 2 are shown in Table 2.

testing and presence of cell cracks is investigated, it is judged as "with cell cracks" if there are one or more visually checkable cell cracks, and as "no cracks" for the others, and it is ranked "⊚" when a percentage of "no cell cracks" in all joints is 90% or more, "○" when the percentage of "no cell cracks" is 70% or more and less than 90%, and "X" when the percentage of "no cell cracks" is less than 70%. The percentage of "no cell cracks" is calculated by following formula.

(Percentage of no cell cracks)=[(the number of cells in which cracks are not generated)/(the number of cells to which the solder testing is conducted)]×100

As for a section of "Uniformity of thickness of upper and lower plated films in Table 2, plating thicknesses of the center portions of the upper and lower molten solder plated layers in a width direction are each measured, and it is ranked "X" when the difference is 10 μm or more, and "○" for the others.

In addition, Examples 2 and 3 were implemented based on the same criteria by comparing the thickness of the molten solder plating on both surfaces of a portion other than the concave portion.

When the thickness of the solder plated layers are different on both surfaces of the ribbon-shaped conductive material, since a molten amount is different, degree of strain generation is different, which thus leads to the cracks on the solder plated layer as-manufactured and variation in frequency of the strain generation. In addition, regarding the surface with low molten amount, the joint strength becomes low.

As for a section of "Flatness of plated surface" in Table 2, the cross sections of the solar cell lead wires are photographed and an acceptable range is determined as up to ±7 μm in absolute values with reference to a flat surface of the molten solder plated layer (for the Comparative Example 1, the most protruding portion), which is ranked as "○". The case exceeding the acceptable range is ranked as "X".

TABLE 2

| | | Ex 1 | Ex 2 | Ex 3 | Ex 4 | Ex 5 | Ex 6 | Comp Ex 1 | Comp Ex 2 |
|---|---|---|---|---|---|---|---|---|---|
| | | | | | Cross sectional shape | | | | |
| | | FIG. 1A | FIG. 1A | FIG. 1B | FIG. 1B | FIG. 1C | FIG. 1C | FIG. 7 | — |
| Joint force | Upper surface | ⊚ | ⊚ | ⊚ | ⊚ | ⊚ | ⊚ | ○ | ⊚ |
| | Lower surface | ⊚ | ⊚ | ⊚ | ⊚ | ⊚ | ⊚ | ○ | X |
| Cell crack | Upper surface | ○ | ○ | ○ | ○ | ○ | ○ | X | ○ |
| | Lower surface | ○ | ○ | ○ | ○ | ○ | ○ | X | ○ |
| Flatness of plated surface | | ○ | ○ | ○ | ○ | ○ | ○ | X | ○ |
| Uniformity of thickness of upper and lower plated layers | | ○ | ○ | ○ | ○ | ○ | ○ | ○ | X |

Notes:
Ex = Example, Comp Ex = Comparative Example

A section of "Cross sectional shape" in Table 2 indicates the figure number corresponding to the cross sectional shapes.

A section of "Joint force" in Table 2 shows the results of testing a pull force level to peel the joint by pulling the copper plate and the solar cell lead wire in the 90° peeling test, "⊚" indicates the pull force of 20N or more, "○" indicates the pull force of 10-20N, and "X" indicates pull force of 10N.

As for a section of "Cell crack" in Table 2, when rectangular wires are jointed to both surfaces of a cell by a solder As shown in Table 2, in the solar cell lead wires of Examples 1-3, it was confirmed that, since the molten solder was supplied on upper and lower surfaces and the molten solder plated layer was substantially formed flat by rolling, it is possible to obtain excellent joint force.

In particular, in the solar cell lead wire 11 of the Example 1, since the molten solder is sufficiently supplied on upper and lower surfaces from the center portion to the edge portion and the molten solder plated layer 13 is formed flat, the solder which contributes to the joint is sufficiently supplied and a good fillet is formed, which thus leads to high joint force.

In the solar cell lead wire 11 of the Example 1, since the joint surface with the semiconductor substrate is flat, not point contact like the conventional solar cell (FIG. 6), but surface contact like the solar cell of the invention (FIG. 5) is possible, furthermore, since the molten solder is sufficiently supplied from the center portion to the edge portion and the amount of the solder contributing to the joint is thus large, a good solder fillet is formed. As a result, joint properties (strength and conductivity) are improved.

In addition, as shown in Table 2, in the solar cell lead wires 11 of Examples 1-3, it was confirmed that, since the molten solder plated layers 13 are formed flat on upper and lower surfaces by roll-plating, a cell crack is suppressed.

In contrast, in Comparative Example 1 in which the rolling process is not carried out after the plating, the flatness of the plated surface is bad and cell cracks are found, hence, the joint force is slightly inferior to the invention.

In Comparative Example 2 in which the rolling process is applied in a state that the solder plated layer is molten, since the ribbon-shaped conductive material is eccentric, a difference is generated in a thickness of the molten solder plated layers present on both surfaces of the ribbon-shaped conductive material, hence, the joint force of the lower surface was inferior to the invention.

As described above, from the evaluation results of Examples 1-6 and Comparative Examples 1 and 2, it was confirmed that the cell crack suppressing effect of the invention is high.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method of manufacturing a solar cell lead wire, said method comprising:
    feeding an elongate conductive material from a feed reel, the elongate conductive material comprising a rectangular conductor or a round conductor;
    soaking the conductive material in a molten solder plating bath;
    cooling the conductive material to have a plated wire with a solder plated layer formed on the conductive material, wherein the plated wire is formed to have a rectangular shape in a sectional view, and an upper surface and a lower surface thereof are formed flat by rolling using a mill roll after the solder plated layer of the plated wire is solidified by the cooling;
    applying a heat treatment to the plated wire at a temperature not higher than a melting point of the solder plated layer after the rolling; and
    winding the plated wire on a winding reel.

2. The method of manufacturing a solar cell lead wire according to claim 1, further comprising:
    passing the conductive material through a furnace that includes an inert gas atmosphere.

3. The method of manufacturing a solar cell lead wire according to claim 1, wherein the solder plated layer formed on a front surface of the conductive material comprises substantially a same thickness as that formed on a back surface of the conductive material.

4. The method of manufacturing a solar cell lead wire according to claim 1, wherein the conductive material comprises a recess on a surface thereof for receiving the solder plated layer.

5. The method of manufacturing a solar cell lead wire according to claim 1, wherein the conductive material comprises a rectangular conductor comprising recesses for receiving the solder plated layer at a position line-symmetrical with respect to a center line of the rectangular conductor in a horizontal direction.

6. The method of manufacturing a solar cell lead wire according to claim 1, wherein the conductive material has a 0.2% proof stress of 90 MPa or less caused by said applying a heat treatment to the conductive material.

7. The method of manufacturing a solar cell lead wire according to claim 3, further comprising:
    after the heating treatment, further rolling the plated wire for flattening the plated wire.

8. The method of manufacturing a solar cell lead wire according to claim 1, wherein said forming the solder plated layer comprises solder plating on a peripheral surface of the conductive material.

9. The method of manufacturing a solar cell lead wire according to claim 1, wherein the heating treatment comprises applying heat to the plated wire no more at a temperature of a melting point of the molten solder.

10. The method of manufacturing a solar cell lead wire according to claim 1, wherein the solder plated layer comprises a Sn—Pb-based solder.

11. The method of manufacturing a solar cell lead wire according to claim 1, wherein the conductive material comprises a heat treated Cu.

12. The method of manufacturing a solar cell lead wire according to claim 1, wherein the conductive material has a rectangular shape in the sectional view, an upper surface and a lower surface of the conductive material being parallel to the upper surface and the lower surface of the plated wire, respectively.

13. The method of manufacturing a solar cell lead wire according to claim 1, wherein an upper surface and a lower surface of the conductive material comprise a recess for storing the solder plated layer, and
    wherein the upper surface and the lower surface of the conductive material are parallel to the upper surface and the lower surface of the plated wire, respectively.

14. A method of manufacturing a solar cell lead wire, said method comprising:
    feeding an elongate conductive material from a feed reel, the elongate conductive material comprising a rectangular conductor or a round conductor;
    soaking the conductive material in a molten solder plating bath;
    cooling the conductive material to have a plated wire with a solder plated layer formed on the conductive material, wherein the plated wire is formed to have a rectangular shape in a sectional view, and an upper surface and a lower surface thereof are formed flat by rolling after the solder plated layer of the plated wire is solidified by the cooling;
    applying a heat treatment to the plated wire after the rolling; and
    winding the plated wire on a winding reel.

15. The method of claim 14, wherein the heat treatment to the plated wire is conducted at a temperature not higher than a melting point of the solder plated layer.

16. The method of claim 14, wherein said rolling comprises applying a mill roll.

* * * * *